United States Patent
Shimanek

(12) 
(10) Patent No.: US 6,353,331 B1
(45) Date of Patent: Mar. 5, 2002

(54) COMPLEX PROGRAMMABLE LOGIC DEVICE WITH LOOKUP TABLE

(75) Inventor: Schuyler E. Shimanek, Alburquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/613,171

(22) Filed: Jul. 10, 2000

(51) Int. Cl.[7] .............................................. H03K 19/177
(52) U.S. Cl. ............................................. 326/39; 326/40
(58) Field of Search .............................. 326/38, 39, 40, 326/41

(56) References Cited

U.S. PATENT DOCUMENTS

| 5,081,375 A | * | 1/1992 | Pickett et al. ................. 326/39 |
| 5,638,008 A | * | 6/1997 | Rangasayee et al. .......... 326/39 |
| 5,684,413 A | | 11/1997 | Shimanek et al. ............. 326/41 |
| 5,694,055 A | | 12/1997 | Shimanek ..................... 326/37 |
| 5,714,890 A | | 2/1998 | Cline ........................... 326/40 |
| 6,255,846 B1 | * | 7/2001 | Lee et al. |
| 6,278,290 B1 | * | 8/2001 | Young .......................... 326/41 |

\* cited by examiner

*Primary Examiner*—Tuan T. Lam
(74) *Attorney, Agent, or Firm*—Patrick T. Bever

(57) ABSTRACT

A programmable logic device (PLD) structure that combines the AND/OR structure of a CPLD with the look-up table (LUT)-based logic structure of a field programmable gate array (FPGA) to implement both wide logic functions and complex logic functions in a single pass. In one embodiment, a CPLD includes a programmable AND array, a programmable OR array, and several look-up tables (LUTs) that are connected to receive product-terms from the programmable AND array and sum-terms from the programmable OR array. The programmable AND array is programmable connected to multiple input lines, and the programmable OR array is programmably connected to receive selected product-terms generated by a group of AND gates of the programmable AND array. Each LUT includes memory cells that are addressed by the sum-term and product-term applied to the LUT input terminals.

20 Claims, 3 Drawing Sheets

US 6,353,331 B1

COMPLEX PROGRAMMABLE LOGIC DEVICE WITH LOOKUP TABLE

FIELD OF THE INVENTION

The present invention relates to the fabrication of integrated circuits, and more particularly to programmable logic devices.

RELATED ART

Programmable logic devices (PLDs) are general-purpose integrated circuits that include both user-configurable circuitry and a configuration memory array that stores user-generated configuration data. The user-configurable circuitry typically includes logic elements and associated interconnect resources that are connected to the memory cells of the configuration memory array, and are programmed (configured) by the configuration data stored in the configuration memory array to implement user-defined Logic operations (that is, a user's circuit). Examples of PLDs include field programmable gate arrays (FPGAs), such as the Virtex™ family of FPGAs produced by Xilinx, Inc. of San Jose, Calif., and complex programmable logic devices (CPLDs), such as the XC9500 family of CPLDs produced by Xilinx, Inc.

FIG. 1 shows a portion of a field programmable gate array (FPGA) 100, which is one type of PLD. Although greatly simplified, FPGA 100 is generally consistent with FPGAs produced by Xilinx, Inc. of San Jose, Calif. FPGA 100 includes an array of configurable logic blocks (CLBs), input/output blocks (IOBs), and programmable interconnect resources that include interconnect lines 110 extending between the CLBs and IOBs. Each CLB includes a look-up table (LUT) and optional output registers (e.g., flip-flops), and conductive wires that extend from the CLB for selective connection to the interconnect lines. Each interconnect line 110 includes a series of wiring segments that are programmably coupled at their respective ends via programmable multi-way segment-to-segment switches (indicated by diamond shapes). In addition, vertical wiring segments are connectable to the conductive wires of associated CLBs via segment-to-CLB input switches, and output signals from each CLB are transmitted to a horizontal wiring segment via CLB-to-segment output switches (also indicated by diamond shapes).

During operation of FPGA 100, each CLB generates a single output signal in response to device input signals (i.e., received on designated device pins) and/or data signals generated by other CLBs of FPGA 100. In particular, in accordance with the configuration data stored in the configuration memory array (not shown) of FPGA 100, device input signals are routed from selected device pins through associated IOBs to the interconnect resources, which are linked by programmable switches to pass the data signals to selected CLBs. Upon entering a CLB, subsets of these input signals are used to address a single data value stored in the memory cells of the LUT. As is understood in the art, LUTs are programmed to implement any logic function of the subset of input signals by storing appropriate data signals in the memory cells of the LUT. The subset of input signals address the appropriate memory cell, and the data value associated with the logic function is generated at the output terminal of the CLB. Data signals output from the various CLBs are either passed to other CLBs, or are passed to selected IOBs for transmission onto a device pin.

An advantage of FPGAs is that the LUT of each CLB can perform any logic function having a few input terms. However, a problem associated with LUT-based FPGAs is that it is difficult to implement wide logic functions using a single LUT. Consequently, several CLBs must be used to implement a wide logic function. Although it is possible to efficiently utilize FPGA resources to connect the necessary CLBs in order to implement a wide logic function, the timing associated with the actual configuration is difficult to predict, and propagation delays increase with each additional CLB through which data signals must pass.

FIG. 2 is a simplified diagram showing a complex programmable logic device (CPLD) 200 that is disclosed in U.S. Pat. No. 5,714,890. CPLD 200 includes dual polarity input lines 201, a programmable AND array 210, a programmable OR array 220, a fixed OR array 230, and several macrocells 240. Programmable AND array 210 is divided into two groups of AND gates: a first group 212 whose output terminals are connected to programmable OR array 220, and a second group 215 whose output terminals are connected to fixed OR array 230. Each AND gate 213 of first group 212 has input terminals connected by programmable switches 214 (indicated by diamond shape) to selectively receive input signals from dual polarity input lines 201, and has an output terminal connected to programmable OR array 220. Similarly, each AND gate 216 of second group 215 has input terminals connected by programmable switches 217 to selectively receive input signals from dual polarity input lines 201, and has an output terminal connected to fixed OR array 230. Each OR gate 221 of programmable OR array 220 is connected by a programmable switch 223 to receive product-terms generated by first group 212 of AND array 210. Each OR gate 233 of fixed OR array 230 is connected to receive a sum-term generated by programmable OR array 220 and/or a product-term generated by second group 215 of AND array 210. Although indicated as an OR gate, each OR gate 233 of fixed OR array 230 can implement a NOR, XOR, or XNOR logic function. Finally, output signals from fixed OR array 230 are selectively transmitted back to programmable AND array 210 on feedback lines 235, or to macrocells 240 (indicated by tri-state buffers) for transmission onto one or more output pins (OP) of CPLD 200.

During operation of CPLD 200, in accordance with the configuration data stored in the configuration memory array (not shown) of CPLD 200, device input signals are routed from selected device input pins (IP) onto dual polarity lines 201, which transmit the input signals in inverted and non-inverted forms into programmable AND array 210. Selected AND gates 213 of first group 212 are programmably connected to receive selected input signals, and produce product-terms that are transmitted to programmable OR array 220. Selected AND gates 216 of second group 215 are programmably connected to receive selected input signals, and produce product-terms that are transmitted to fixed OR array 230. Finally, selected OR gates 221 of programmable OR array 220 are programmably connected to receive selected product-terms from first group 212, and generate sum-terms that are transmitted to fixed OR array 230. Fixed OR array 230 receives product-terms from second group 215 and sum-terms from OR array 220, and produces sum-of-products terms that are transmitted from fixed OR array 230 either back to AND array 210 on feedback lines 235, or to macrocells 240.

CPLD 200 has an advantage over FPGA 100 (discussed above) in that it is capable of implementing certain wide logic functions in a single pass. In particular, because multiple input signals can be combined in programmable AND array 210 and programmable OR array 220, CPLD 200 is capable of performing certain wide logic functions without requiring the use of feedback lines 235. However, unlike LUT-based FPGAs, it is difficult to implement certain complex logic functions in a single pass, often requiring partial solutions to be fed back into programmable AND array 210 on feedback lines 235 in order to implement these complex logic functions. This need to feed back partial solutions lowers resource utilization and greatly increases propagation delay through conventional CPLDs.

What is needed is a PLD structure that is able to implement both wide logic functions and complex logic functions in a single pass.

SUMMARY

The present invention is directed to a programmable logic device (PLD) structure that combines the AND/OR structure of a conventional CPLD with the look-up table (LUT)-based logic structure of a field programmable gate array (FPGA) to implement both wide logic functions and complex logic functions in a single pass, thereby greatly reducing signal propagation delays by eliminating the need for multiple passes through the CPLD logic architecture.

In a first embodiment of the present invention, a CPLD includes a programmable AND array, a programmable OR array, and a look-up table (LUT) that is programmably connected to receive a product-term from the programmable AND array and connected to receive a sum-term from the programmable OR array. The programmable AND array is programmably connected to multiple input lines, and the programmable OR array is programmably connected to receive selected product-terms generated by the AND gates of the programmable AND array, thereby increasing the total input logic width of the LUT over that possible in a FPGA. Further, in comparison to conventional CPLDS, by replacing fixed function logic gates with the LUT, a substantially larger number of logic functions can be performed in a single pass through the CPLD of the present invention. Accordingly, not only does the present invention reduce chip resource usage over conventional FPGAs, but it also reduces signal propagation delay over conventional CPLDs by eliminating or reducing the need for multiple passes through the programmable AND array.

In accordance with a second embodiment of the present invention, the AND gates of the programmable AND array are separated into a first group whose product terms are transmitted to the programmable OR array, and a second group whose product terms are transmitted to the LUTs.

The present invention will be more fully understood in view of the following description and drawings.

DETAILED DESCRIPTION

Figure 1:
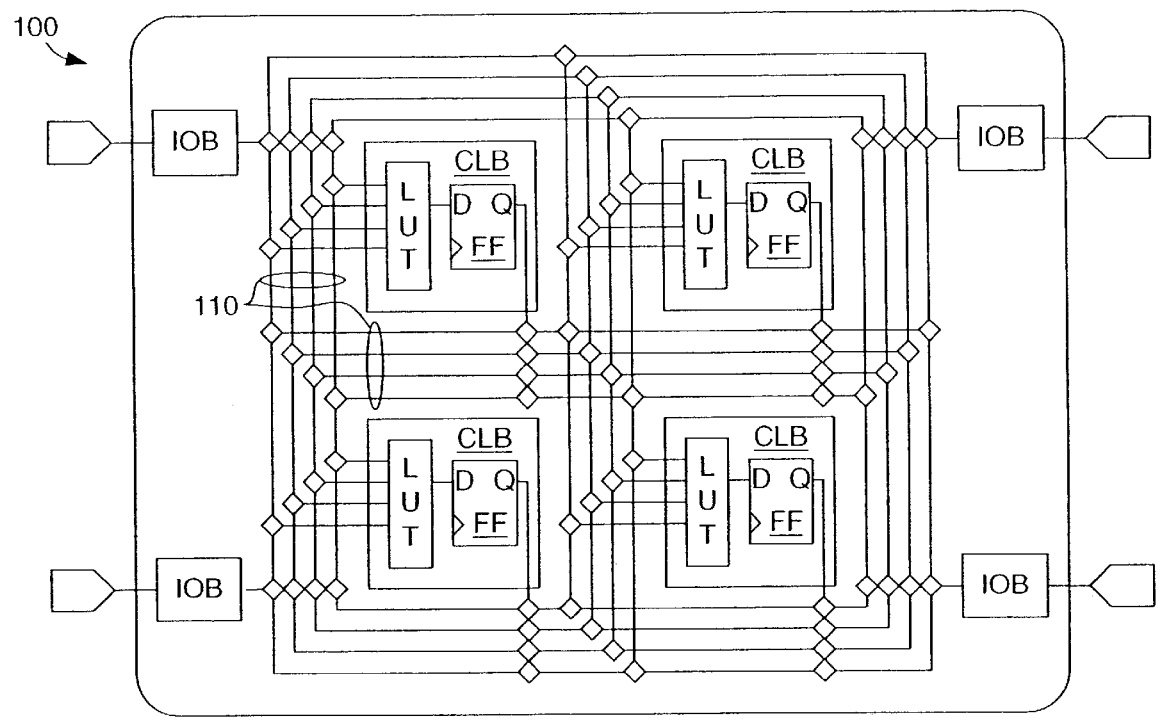
FIG. 1 is simplified diagram showing a conventional FPGA.
Figure 2:
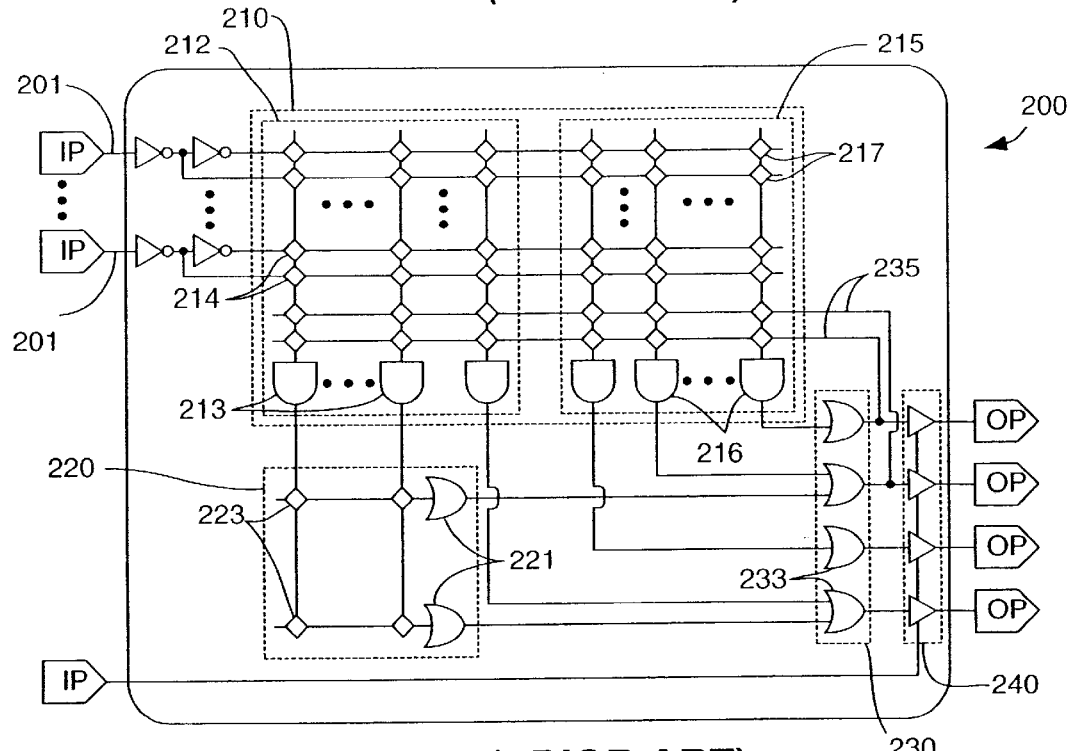
FIG. 2 is simplified diagram showing a conventional CPLD.
Figure 3:
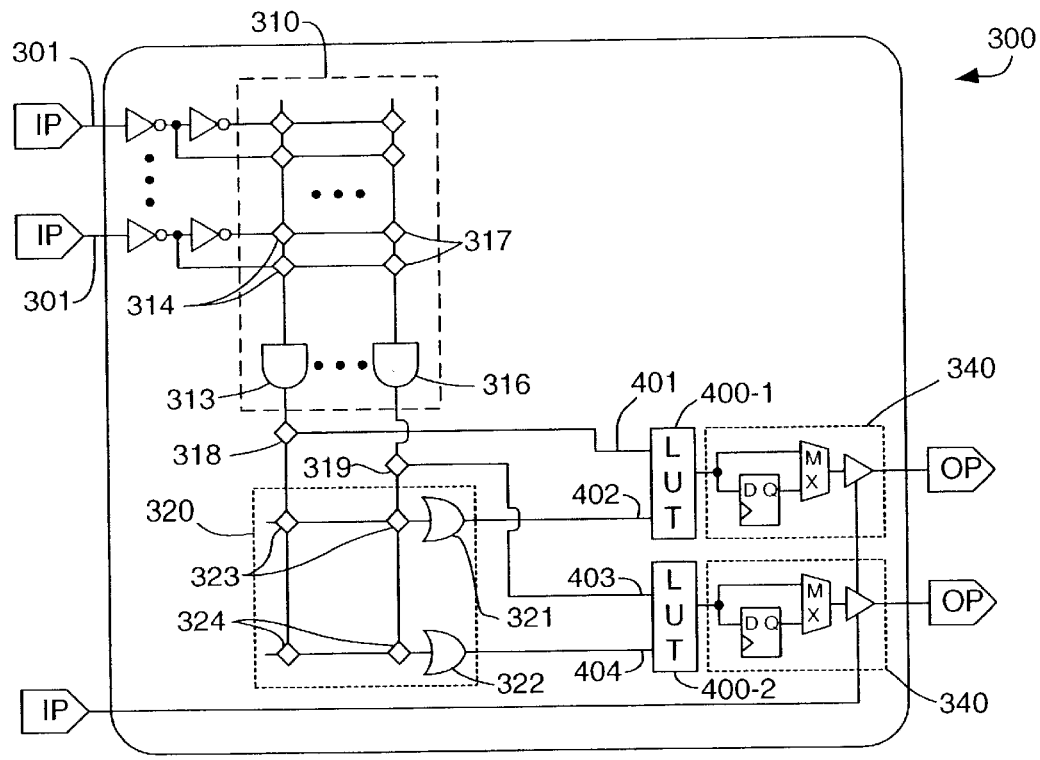
FIG. 3 is simplified diagram showing a CPLD in accordance with a first embodiment of the present invention.

FIG. 3 is a simplified diagram showing a programmable logic device (CPLD) 300 according to a first embodiment of the present invention. Similar to prior art CPLD 200 (see FIG. 2), CPLD 300 includes dual polarity input lines 301, a programmable AND array 310, a programmable OR array 320, and several macrocells 340. CPLD 300 is distinguished over prior art PLD 200 in that, instead of fixed function logic gates (e.g., OR gates 233 of PLD 200; see FIG. 2), CPLD 300 includes look-up tables (LUTs) 400 (e.g., LUT 400-1 and LUT 400-2) that have input terminals connected to receive a fixed number of the product-terms and sum-terms generated by programmable AND array 310 and programmable OR array 320, respectively. Because AND array 310 is programmably connected to multiple input lines 301, the total width of the input logic of each LUT 400 is substantially increased over that of a FPGA. Further, in comparison to conventional CPLDs, by replacing fixed function logic gates (e.g., OR gates 233 of conventional CPLD 200; see FIG. 2) with LUTs 400, a substantially larger number of logic functions can be performed on the product-terms and sum-terms in a single pass through programmable AND array 310. Accordingly, not only does the present invention reduce chip resource usage over conventional FPGAs by implementing wide logic functions, but it also reduces signal propagation delay over conventional CPLDs by implementing a wide range of logic functions using LUTs 400, thereby eliminating or reducing the need for multiple passes through AND array 310. In addition, a further reduction in propagation delay is also achieved because, in most cases, signal propagation takes less time through LUTs 400 than through most fixed logic gates (such as OR gates 233; see FIG. 2).

As in prior art PLD 200, dual polarity input lines 301 of CPLD 300 are used to transmit input signals from I?LD input pins (IP) to AND array 310. Each dual polarity line 301 includes one or more inverters used to transmit an input signal from an associated input pin (IP) into programmable AND array 310 in a "true" (non-inverted) and "complement" (inverted) form.

Programmable AND array 310 includes multiple AND (logic) gates (or equivalent logic structures) that are programmably connected to input lines 301. For example, the input terminal(s) of a first AND gate 313 is/are programmably connected through programmable elements 314 (indicated by diamonds) to receive input signals from input lines 301. In addition, a second AND gate 316 is programmably connected through programmable elements 317 (indicated by diamonds) to receive input signals from input lines 301. As in prior art PLD 200 (see FIG. 2), programmable elements 314 and 317 are selectively programmed by user-generated configuration data that is stored in a configuration memory (not shown) of CPLD 300

Product-terms generated by AND array 310 are selectively routed either to programmable OR array 320 or to LUT 400. For example, the output terminal of first AND gate 313 is programmably connected through programmable element 318 either to OR array 320 or to input terminal 401 of LUT 400-1, depending upon configuration data provided by a user. Similarly, the output terminal of second AND gate 316 is programmably connected through programmable element 319 either to OR array 320 or to input terminal 403 of LUT 400-2. Programmable elements 318 and 319 are selectively programmed by user-generated configuration data that is stored in a configuration memory (not shown) of CPLD 300.

Programmable OR array 320 provides a third group of logic gates that, in the disclosed embodiment, include OR gates 321 and 322 (or equivalent logic structures) that are connected via programmable elements 323 and 324 to receive selected product-terms generated by AND gates 313 and 316. For example, the input terminal(s) of first OR gate 321 is/are programmably connected to receive one or both product-terms generated by first AND gate 313 and second AND gate 316 through programmable elements 323. Similarly, the input terminal(s) of second OR gate 322 is/are programmably connected to receive one or both product-terms generated by first AND gate 313 and second AND gate 316 through programmable elements 324. As in prior art PLD 200 (see FIG. 2), programmable elements 323 and 324 are selectively programmed by user-generated configuration data that is stored in a configuration memory (not shown) of CPLD 300.

In the disclosed embodiment, each LUT 400 of CPLD 300 has memory cells for storing data values, a first input terminal programmably connected to receive a product-term from an associated AND gate, and a second input terminal connected to receive a sum-term from an associated OR gate. For example, first input terminal 401 of LUT 400-1 is connected to selectively receive a product-term generated by first AND gate 313 via programmable switch 318, and second input terminal 402 is connected to receive a sum-term generated by first OR gate 321. Similarly, first input terminal 403 of LUT 400-2 is connected to selectively receive a product-term generated by second AND gate 316 via programmable switch 319, and second input terminal 404 is connected to receive a sum-term generated by second OR gate 322. LUTs 400-1 and 400-2 transmit the data value from a selected memory cell in response to the product-term received from the associated AND gates 313 and 316 and/or the sum-term received from the associated OR gates 321 and 322, respectively.

Figure 4:
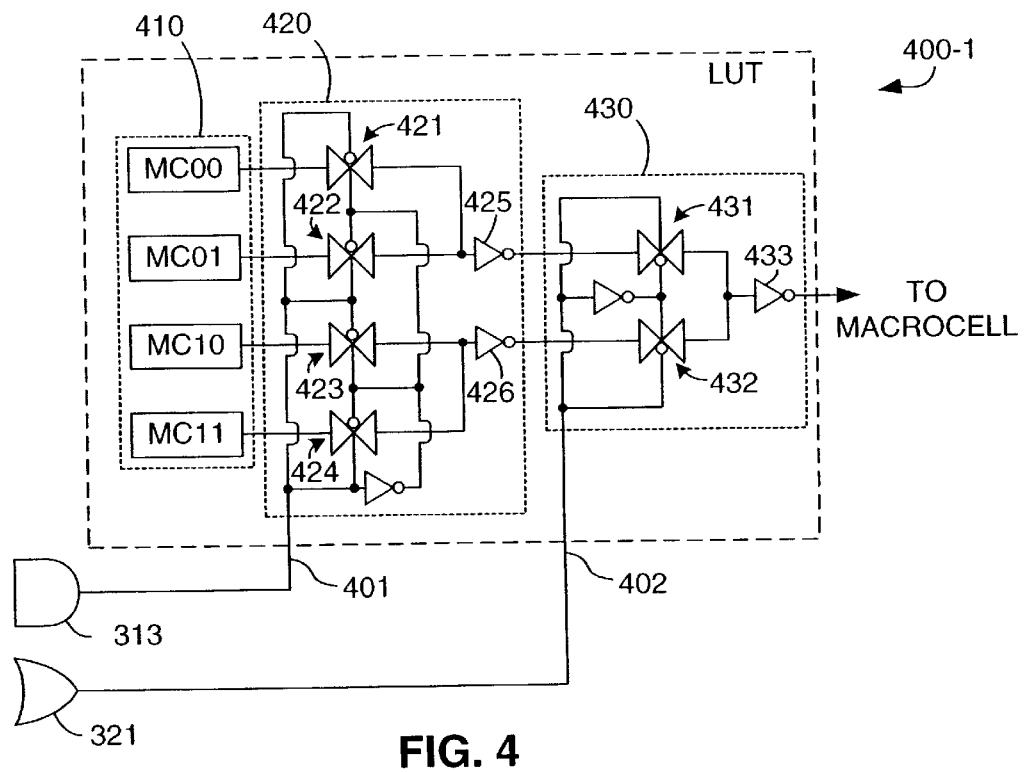
FIG. 4 is a simplified diagram showing a LUT of the CPLD shown in FIG. 3.

FIG. 4 is a simplified schematic diagram showing LUT 400-1 in accordance with an embodiment of the present invention (LUT 400-2 is typically identical to LUT 400-1). LUT 400-1 includes memory array 410, a first multiplexer 420, and a second multiplexer 430. Memory array 410 includes four memory cells MC00 through MC11 for storing data values that represent a desired logic function. First multiplexer 420 includes four CMOS switches 421 through 424 and two optional inverters 425 and 426. The four data values stored in memory cells MC00 through MC11 are applied to input terminals of CMOS switches 421 through 424, respectively, which are controlled to pass two of the four data values according to the product-term received from associated AND gate 313 (assuming programmable element 318 (not shown) is programmed to pass the product-term to input terminal 401). The two data values passed by CMOS switches 421 through 424 are then transmitted via optional inverters 425 and 426 to second multiplexer 430. Multiplexer 430 includes two CMOS switches 431 and 432 and an optional inverter 433. The two data values passed by first multiplexer 420 are applied to input terminals of CMOS switches 431 and 432, which are controlled to pass a selected data value of the two data values according to the sum-term received from associated OR gate 321. The selected data value passed by CMOS switches 431 and 432 is then transmitted via optional inverter 433 to an associated macrocell of CPLD 300 (see FIG. 3).

Returning to FIG. 3, each macrocell 340 includes a flip-flop and other control circuitry (e.g., an output multiplexer (MX)) that are well known in the art. The output signal passed by macrocell 340 is applied to an output pin (OP) of CPLD 300.

Figure 5:
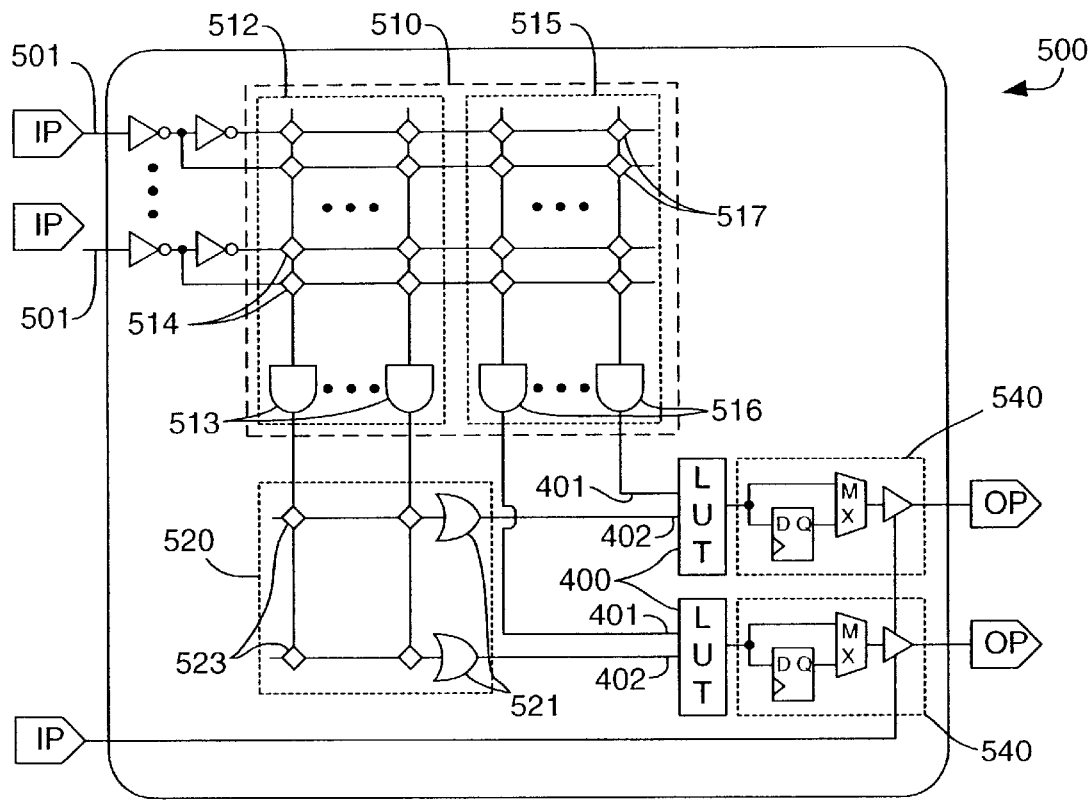
FIG. 5 is simplified diagram showing a CPLD in accordance with a second embodiment of the present invention.

FIG. 5 is a simplified diagram showing a programmable logic device (CPLD) 500 according to a second embodiment of the present invention. CPLD 500 includes dual polarity input lines 501, a programmable AND array 510, a programmable OR array 520, and several macrocells 540. Similar to CPLD 300 (discussed above), CPLD 500 is distinguished over prior art PLD 200 in that it includes look-up tables 400 that have input terminals connected to receive product-terms from programmable AND array 510 and sum-terms from programmable OR array 520. However, unlike CPLD 300, selected product-terms generated by AND array 510 are applied directly to LUTs 400 (instead of through programmable connections).

Referring to the upper portion of FIG. 5, programmable AND array 510 includes multiple AND (logic) gates (or equivalent logic structures) that are separated into a first AND gate group 512 and a second AND gate group 515. First AND gate group 512 includes AND gates 513 that are programmably connected through programmable elements 514 to receive input signals from input lines 501. Second AND gate group 515 includes AND gates 516 that are programmably connected through programmable elements 517 to receive input signals from input lines 501. Note that the product-terms generated by first AND gate group 512 are transmitted to programmable OR array 520, and the product-terms generated by second AND group 515 are transmitted to LUTs 400.

Programmable OR array 520 provides a third group of logic gates that, in the disclosed embodiment, include OR gates 521 (or equivalent logic structures) that are connected via programmable elements 523 to receive selected product-terms generated by first AND gate group 512.

Each LUT 400 of CPLD 500 has memory cells for storing data values, a first input terminal 401 connected to an associated AND gate 516 of second AND gate group 512, and a second input terminal 402 connected to an associated OR gate 521 of OR array 520. LUT 400 transmits the data value from a selected memory cell to an associated macrocell 540 in response to the product-term received from the associated AND gate 516 and the sum-term received from the associated OR gate 521 in the manner described above.

The process or technology by which PLDs according to the present invention are made is not important and any of the standard bipolar, NMOS or CMOS processes can be used. Also, it will be clear from the foregoing that the number of LUT input terms, that is, the number of product-terms and sum-terms used to address a memory cell of a LUT, can be varied without departing from the principles described herein. Further, the circuit arrangement utilized to form each LUT is not limited to the arrangement shown in FIG. 4. It will also be clear that the programmable elements utilized to make selective (programmable) connections in the AND arrays and OR arrays may be implemented using any well known technologies, including fuse, anti-fuse, SRAM, or any form of electrically-erasable floating gate memory element.

Further, CPLDs 300 and 500 are described as including logic AND and OR gates that generate sum-of-products terms according to a desired logic function. While the present invention is described in terms of AND and OR gate arrays, as is well known in the art, logical NAND and NOR gates may be utilized in conjunction with or as substitutes for the AND and OR gates.

It will also be clear that any type of macrocell can be used in place of simplified macrocell 540 without departing from the scope of the invention.

Figure 6:
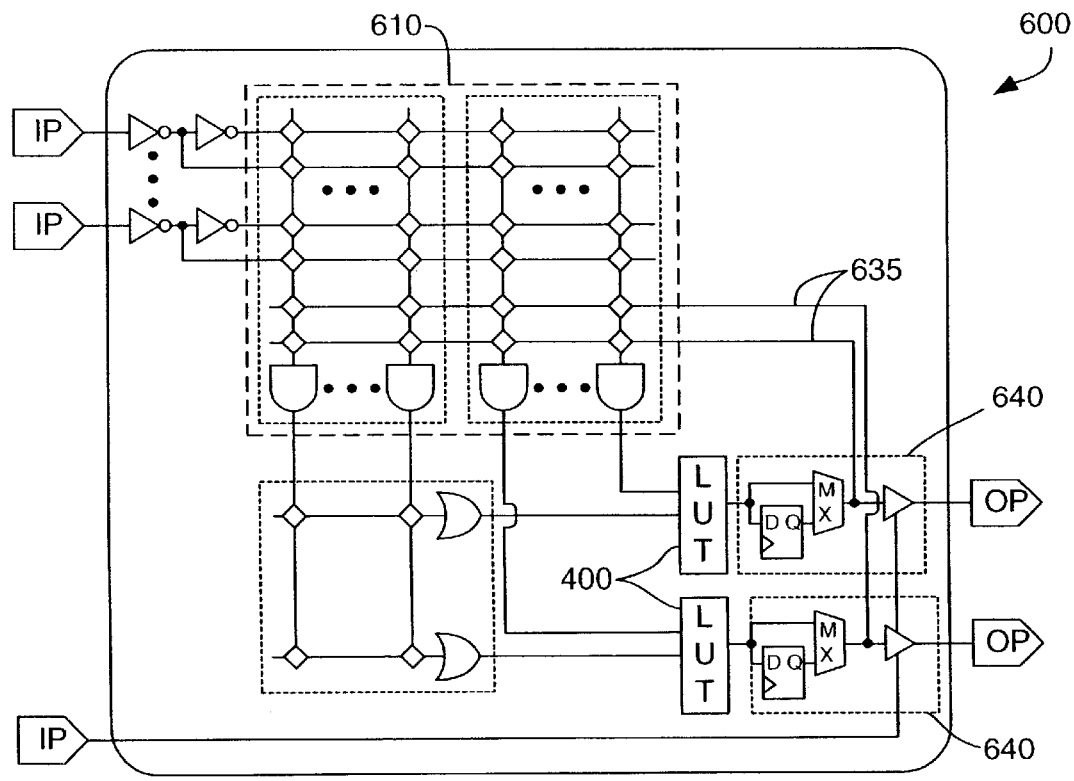
FIG. 6 is simplified diagram showing a CPLD in accordance with yet another embodiment of the present invention.

Finally, while the disclosed embodiment eliminates feedback lines due to the versatility of the disclosed PLD architecture, in another embodiment feedback lines may be provided to further widen the scope of functions that can be performed by the PLD structure of the present invention. FIG. 6 shows a CPLD 600 similar to that of FIG. 5 in which feedback lines 635 are added between macrocells 640 and AND array 610, thereby allowing data values generated by LUTs 400 to be utilized as partial solutions in complex logic functions. Of course, similar feedback lines can be utilized in the embodiment shown in FIG. 3.

As suggested above, in addition to the specific embodiments disclosed herein, other modifications are also possible that fall within the spirit and scope of the present invention. Therefore, the invention is limited only by the following claims.

What is claimed is:

1. A programmable logic device, comprising:
   a plurality of input lines for transmitting a plurality of input signals;
   a first group of logic gates, each logic gate of the first group being programmably connected to the plurality of input lines such that each logic gate of the first group selectively generates a first logic term in response to a first selected group of said input signals;
   a second group of logic gates, each logic gate of the second group being programmably connected to the first group of logic gates such that each logic gate of the second group selectively generates a second logic term in response to a second selected group of said first logic terms; and
   a look-up table having a plurality of memory cells for storing data values, a first input terminal programmably connected to an associated logic gate of the first group of logic gates, and a second input terminal connected to an associated logic gate of the second group of logic gates.

2. The programmable logic device according to claim 1, wherein the first group of logic gates comprises AND gates.

3. The programmable logic device according to claim 1, wherein the second group of logic gates comprises OR gates.

4. The programmable logic device according to claim 1, wherein each of said plurality of input lines comprises dual polarity lines.

5. The programmable logic device according to claim 1, wherein the look-up table further comprises a first multiplexer for passing selected data values from one-half of the plurality of memory cells in response to a first logic value received on the second input terminal, and a second multiplexer for passing one-half of the selected data values passed from the first multiplexer in response to a second logic value received on the first input terminal.

6. The programmable logic device according to claim 1, further comprising a plurality of macrocells, each macrocell being connected to an output terminal of the look-up table.

7. The programmable logic device according to claim 6, further comprising a feedback line extending from one of the macrocells to the first group of logic gates.

8. A programmable logic device comprising:
   a plurality of input lines for transmitting a plurality of input signals;
   a first group of logic gates, each logic gate of the first group being programmably connected to the plurality of input lines such that each logic gate of the first group selectively generates a first logic term in response to a first selected group of said input signals;
   a second group of logic gates, each logic gate of the second group being programmably connected to the plurality of input lines such that each logic gate of the second group selectively generates a second logic term in response to a second selected group of said input signals;
   a third group of logic gates, each logic gate of the third group being programmably connected to the first group of logic gates such that each logic gate of the third group selectively generates a third logic term in response to a selected group of said first logic terms; and
   a look-up table having a plurality of memory cells for storing data values, a first input terminal connected to an associated logic gate of the second group of logic gates, and a second input terminal connected to an associated logic gate of the third group of logic gates.

9. The programmable logic device according to claim 8, wherein the first group of logic gates comprises AND gates.

10. The programmable logic device according to claim 8, wherein the second group of logic gates comprises AND gates.

11. The programmable logic device according to claim 8, wherein the third group of logic gates comprises OR gates.

12. The programmable logic device according to claim 8, wherein each of said plurality of input lines comprises dual polarity lines.

13. The programmable logic device according to claim 8, wherein the look-up table further comprises a first multiplexer for passing selected data values from one-half of the plurality of memory cells in response to a first logic value received on the second input terminal, and a second multiplexer for passing one-half of the selected data values passed from the first multiplexer in response to a second logic value received on the first input terminal.

14. The programmable logic device according to claim 8, further comprising a plurality of macrocells, each macrocell being connected to an output terminal of the look-up table.

15. The programmable logic device according to claim 14, further comprising a feedback line extending from one of the macrocells to the second group of logic gates.

16. A programmable logic device comprising:
   a plurality of input lines for receiving a plurality of input signals;
   an AND array including a plurality of AND gates, each AND gate being programmably connected to the plurality of input lines such that each AND gate selectively generates a product term in response to a selected group of the input signals, wherein the plurality of AND gates includes a first AND gate group and a second AND gate group;
   an OR array including a plurality of OR gates, each OR gate being programmably connected to the first AND gate group such that each OR gate selectively generates a sum term in response to selected product terms generated by the first AND gate group; and
   a look-up table having a plurality of memory cells for storing data values, a first input terminal connected to receive a product term from an associated AND gate of the second AND gate group, and a second input terminal connected to receive a sum term from an associated OR gate of the OR array,
   wherein a data value is transmitted from a selected memory cell in response to the product term received from the associated AND gate and the sum term received from the associated OR gate.

17. The programmable logic device according to claim 16, wherein each of said plurality of input lines comprises dual polarity lines.

18. The programmable logic device according to claim 16, wherein the look-up table further comprises a first multiplexer for passing selected data values from one-half of the plurality of memory cells in response to the sum term received on the second input terminal, and a second multiplexer for passing one-half of the selected data values passed from the first multiplexer in response to the product term received on the first input terminal.

19. The programmable logic device according to claim 16, further comprising a plurality of macrocells, each macrocell being connected to an output terminal of the look-up table.

20. The programmable logic device according to claim 19, further comprising a feedback line extending from one of the macrocells to the AND array.

* * * * *